(12) United States Patent
Uchida et al.

(10) Patent No.: US 8,445,315 B2
(45) Date of Patent: May 21, 2013

(54) THIN-FILM SOLAR BATTERY MODULE MANUFACTURING METHOD

(75) Inventors: Hiroto Uchida, Chigasaki (JP); Yuko Taguchi, Chigasaki (JP); Masashi Ueda, Chigasaki (JP); Michihiro Takayama, Chigasaki (JP)

(73) Assignee: Ulvac, Inc., Chigasaki-shi, Kanagawa (JP)

( * ) Notice: Subject to any disclaimer, the term of this patent is extended or adjusted under 35 U.S.C. 154(b) by 260 days.

(21) Appl. No.: 12/992,125

(22) PCT Filed: May 12, 2009

(86) PCT No.: PCT/JP2009/058854
§ 371 (c)(1),
(2), (4) Date: Jan. 26, 2011

(87) PCT Pub. No.: WO2009/139389
PCT Pub. Date: Nov. 19, 2009

(65) Prior Publication Data
US 2011/0114161 A1    May 19, 2011

(30) Foreign Application Priority Data

May 15, 2008 (JP) ................................. 2008-128178

(51) Int. Cl.
*H01L 21/00* (2006.01)
(52) U.S. Cl.
USPC ................. 438/98; 438/80; 438/97; 438/125; 438/E31.124; 136/244; 136/256

(58) Field of Classification Search
USPC .. 438/57, 80, 96–98, 125, 457, 624; 136/205, 136/251, 244–246, 256–258
See application file for complete search history.

(56) References Cited

U.S. PATENT DOCUMENTS

| | | | |
|---|---|---|---|
| 6,271,053 B1 * | 8/2001 | Kondo | 438/57 |
| 6,300,556 B1 | 10/2001 | Yamagishi et al. | |
| 2002/0037605 A1 * | 3/2002 | Ninomiya et al. | 438/125 |

FOREIGN PATENT DOCUMENTS

| | | |
|---|---|---|
| JP | 7-202229 A | 8/1995 |
| JP | 2001-68711 A | 8/1995 |
| JP | 2000-150944 A | 5/2000 |
| JP | 2001-53304 A | 2/2001 |
| JP | 2000-349325 A | 3/2001 |
| JP | 3243227 A | 10/2001 |
| JP | 3243232 | 10/2001 |
| JP | 2002-217436 A | 8/2002 |
| JP | 3343229 | 10/2006 |

* cited by examiner

*Primary Examiner* — Dung A. Le
(74) *Attorney, Agent, or Firm* — Harness, Dickey & Pierce, P.L.C.

(57) ABSTRACT

The present invention relates to a thin-film solar battery module manufacturing method and a thin-film solar battery module that are capable of securing dielectric breakdown voltage characteristics of high reliability. An important aspect of the invention relates to forming isolation trenches along peripheral regions of a transparent substrate and thereafter selectively removing electrode and semi-conductor layers to arrive at the thin film solar battery module.

5 Claims, 9 Drawing Sheets

THIN-FILM SOLAR BATTERY MODULE MANUFACTURING METHOD

TECHNICAL FIELD

The present invention relates to a thin-film solar battery module manufacturing method and a thin-film solar battery module that are capable of improving a dielectric breakdown voltage.

BACKGROUND ART

A thin-film solar battery module is manufactured through processes of forming a first electrode layer made of a transparent conductive oxide on a translucent substrate and performing laser scribing, forming a semiconductor layer made of amorphous silicon or the like and performing laser scribing, and forming a thin-film such as a second electrode layer (backside electrode) made of metal or the like and performing laser scribing (see Patent Documents 1 to 3).

Since the first electrode layer, the semiconductor layer, and the second electrode layer are formed by vapor-deposition such as a CVD method and a sputtering method, each of the layers is formed on the entire surface of the translucent substrate. After the respective layers are formed, the layers are laser-scribed on the translucent substrate to isolate the device into a plurality of cells, and adjacent solar cells are connected in series (or in parallel). After that, the entire surfaces of the respective layers are sealed with a resin filling material, thus constituting a thin-film solar battery module.

In such a thin-film solar battery module, there arises a problem that an active portion (power generation region) of a solar cell is modified or eroded by infiltration of moisture or the like from the outside at a time of outdoor use, and power generation characteristics are deteriorated accordingly. One of the causes of the problem is the infiltration of moisture from a gap between the substrate and the filling material at an end portion of the solar cell module. Therefore, there is a demand to prevent moisture from infiltrating from the end portion of the solar cell module and improve weatherability.

In this regard, Patent Documents 1 to 3 disclose a thin-film solar battery module manufacturing method in which a transparent electrode layer, an optical semiconductor layer, and a metal layer that are formed on a translucent glass substrate are removed mechanically or by a light beam over an area of 0.5 mm or more from a circumference of a main surface of the circumferential end portion to expose the transparent electrode layer (or the translucent glass substrate), and an isolation line that electrically isolates an active portion and the circumferential end portion is formed by a light beam on an inner side of the portion removed mechanically or by the light beam.

Patent Document 1: Japanese Patent No. 3243227
Patent Document 2: Japanese Patent No. 3243229
Patent Document 3: Japanese Patent No. 3243232

DISCLOSURE OF THE INVENTION

Problem to be Solved by the Invention

However, in the thin-film solar battery module manufacturing method disclosed in Patent Documents 1 to 3, it is necessary to reliably form an isolation line that electrically isolates an active portion and a circumferential end portion of the thin-film solar battery module in a depth at which the isolation line reaches a surface of the translucent substrate in order to achieve electrical isolation between the active portion and the circumferential end portion. In other words, the process of forming the isolation line requires strict control of process and involves a fear that a dielectric breakdown voltage of the module is reduced if even a part of the transparent electrode layer extending over the isolation line remains.

In view of the circumstances as described above, it is an object of the present invention to provide a thin-film solar battery module manufacturing method and a thin-film solar battery module that are capable of securing dielectric breakdown voltage characteristics of high reliability.

Means for Solving the Problem

In order to achieve the object described above, according to an embodiment of the present invention, there is provided a thin-film solar battery module manufacturing method including forming a first electrode layer on an insulating transparent substrate. A first isolation trench that isolates a peripheral region of the transparent substrate from a power generation region on an inner side thereof is formed to have a depth at which the first isolation trench reaches a surface of the transparent substrate. A semiconductor layer is formed on the transparent substrate. A second electrode layer is formed on the transparent substrate. A second isolation trench is formed at a position closer to the peripheral region side than the first isolation trench, to have a depth at which the second isolation trench reaches the surface of the transparent substrate. The first electrode layer, the semiconductor layer, and the second electrode layer formed in the peripheral region are removed by performing blast treatment on the peripheral region.

Further, in order to achieve the object described above, according to an embodiment of the present invention, there is provided a thin-film solar battery module including an insulating transparent substrate, a first electrode layer, a semiconductor layer, and a second electrode layer.

The transparent substrate has a peripheral region. The first electrode layer is formed on an inner side of the peripheral region of the transparent substrate. The semiconductor layer is laminated on the first electrode layer and covers a circumference of the first electrode layer, the circumference facing the peripheral region. The second electrode layer is laminated on the semiconductor layer and electrically connected to the first electrode layer.

BEST MODES FOR CARRYING OUT THE INVENTION

Figure 1:
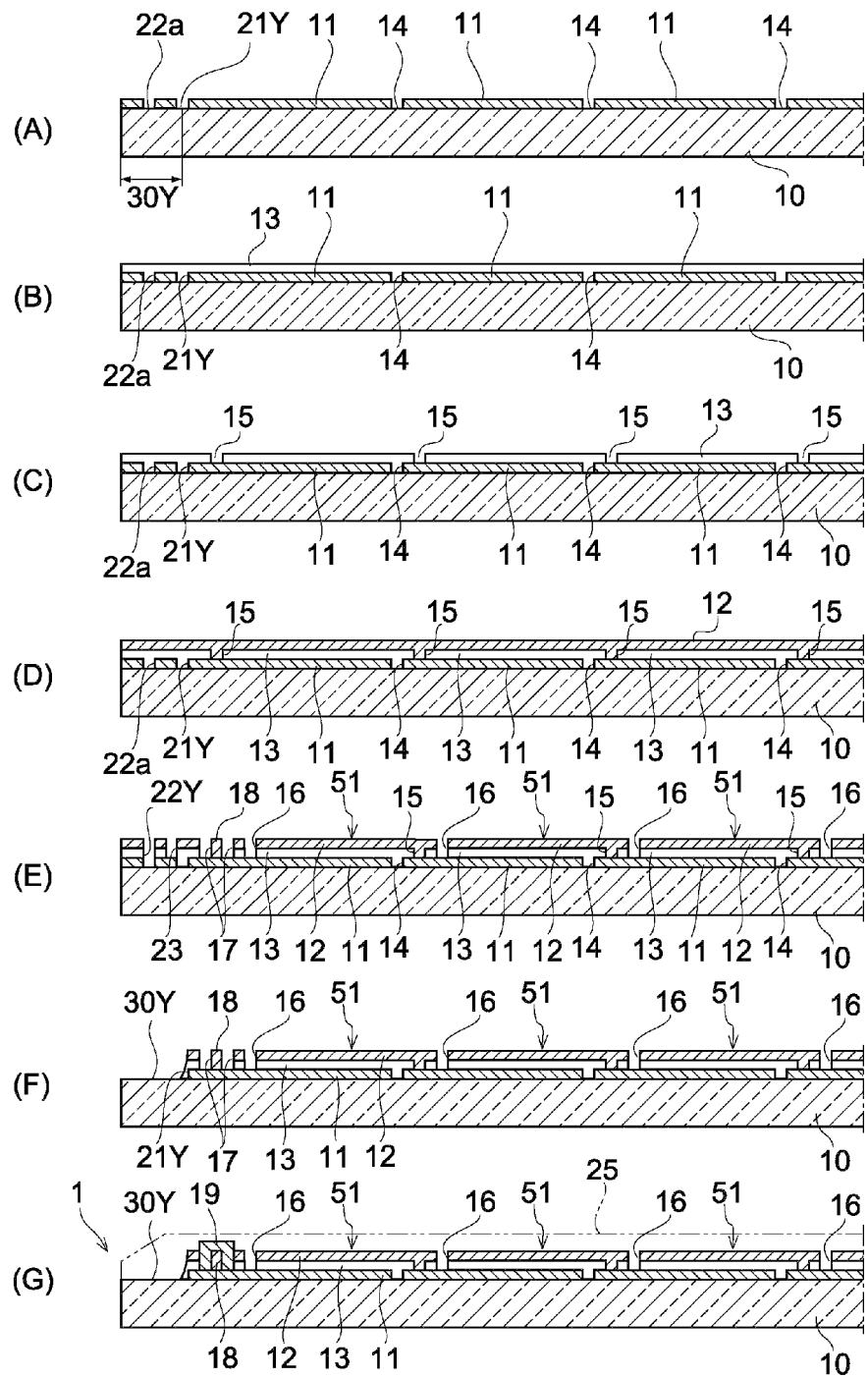
FIG. 1 are main part cross-sectional diagrams for describing processes of a thin-film solar battery module manufacturing method according to a first embodiment of the present invention.

According to an embodiment of the present invention, there is provided a thin-film solar battery module manufacturing method including forming a first electrode layer on an insulating transparent substrate. A first isolation trench that isolates a peripheral region of the transparent substrate from a power generation region on an inner side thereof is formed to have a depth at which the first isolation trench reaches a surface of the transparent substrate. A semiconductor layer is formed on the transparent substrate. A second electrode layer is formed on the transparent substrate. A second isolation trench is formed at a position closer to the peripheral region side than the first isolation trench, to have a depth at which the second isolation trench reaches the surface of the transparent substrate. The first electrode layer, the semiconductor layer, and the second electrode layer formed in the peripheral region are removed by performing blast treatment on the peripheral region.

According to an embodiment of the present invention, there is provided a thin-film solar battery module including an insulating transparent substrate, a first electrode layer, a semiconductor layer, and a second electrode layer.

The transparent substrate has a peripheral region. The first electrode layer is formed on an inner side of the peripheral region of the transparent substrate. The semiconductor layer is laminated on the first electrode layer and covers a circumference of the first electrode layer, the circumference facing the peripheral region. The second electrode layer is laminated on the semiconductor layer and electrically connected to the first electrode layer.

In the thin-film solar battery module manufacturing method, after the second isolation trench is additionally formed on an outer side (peripheral region side) of the first isolation trench, the blast treatment is performed on the peripheral region including this second isolation trench. As a result, the first electrode layer, the semiconductor layer, and the second electrode layer formed in the peripheral region are removed.

Accordingly, even when the second isolation trench is not appropriately formed or residues of the conductive material remain in the second isolation trench, a dielectric breakdown voltage between the peripheral region and the power generation region can be secured in a subsequent blast treatment process. Thus, the peripheral region and the power generation region in the thin-film solar battery module can be electrically isolated from each other reliably, with the result that it is possible to secure dielectric breakdown voltage characteristics of high reliability.

The power generation region of the thin-film solar battery module may be formed of a single power generation layer formed on the transparent substrate, or may be formed of a plurality of cells connected to each other in series or in parallel to each other on the transparent substrate.

In the thin-film solar battery module manufacturing method, the forming a second isolation trench may include laser-scribing, after the second electrode layer is formed, the second electrode layer, the semiconductor layer, and the first electrode layer that are located at a position where the second isolation trench is to be formed.

Accordingly, the peripheral region and the power generation region can be electrically isolated from each other reliably.

Further, in the thin-film solar battery module manufacturing method, the forming a second isolation trench may include laser-scribing, after the first electrode layer is formed, the first electrode layer that is located at a position where the second isolation trench is to be formed, and laser-scribing, after the second electrode layer is formed, the second electrode layer and the semiconductor layer that are located at the position where the second isolation trench is to be formed.

Accordingly, the peripheral region and the power generation region in the thin-film solar battery module can be electrically isolated from each other reliably.

The thin-film solar battery module manufacturing method may further including forming a third isolation trench between the first isolation trench and the second isolation trench, to have a depth at which the third isolation trench reaches at least a surface of the first electrode layer. As to the depth of the third isolation trench, the third isolation trench may reach the surface of the transparent substrate as a coating layer of the first electrode layer.

Accordingly, the peripheral region and the power generation region in the thin-film solar battery module can be electrically isolated from each other more reliably.

In the thin-film solar battery module manufacturing method, the removing the first electrode layer, the semiconductor layer, and the second electrode layer formed in the peripheral region may include performing blast treatment on the peripheral region so that a circumference of the first electrode layer, the circumference facing the first isolation trench, is covered with the semiconductor layer embedded in the first isolation trench.

As a result, the thin-film solar battery module including the semiconductor layer that covers the circumference of the first electrode layer, the circumference facing the peripheral region, is structured.

With this structure, the circumference of the first electrode layer is prevented from being exposed to the outside, with the result that the dielectric breakdown voltage between the circumference of the first electrode layer and the peripheral region can be additionally improved.

Hereinafter, embodiments of the present invention will be described with reference to the drawings.

First Embodiment

FIG. 1 are main part cross-sectional diagrams for describing processes of a thin-film solar battery module manufacturing method according to a first embodiment of the present invention.

(Process of FIG. 1(A))

First, as shown in FIG. 1(A), a transparent electrode layer 11 is formed as a first electrode layer on an insulating transparent substrate 10.

The transparent substrate 10 has a rectangular shape and is typically a glass substrate. A plastic substrate or a ceramic substrate can also be used other than the glass substrate. Further, the transparent electrode layer 11 (TCO: Transparent Conductive Oxide) is formed of a transparent conductive film made of an ITO (Indium Tin Oxide), $SnO_2$, ZnO, or the like. The transparent electrode layer 11 is formed in a predetermined thickness on the entire surface of the transparent substrate 10 by a CVD method, a sputtering method, a coating method, or the like.

Figure 2:
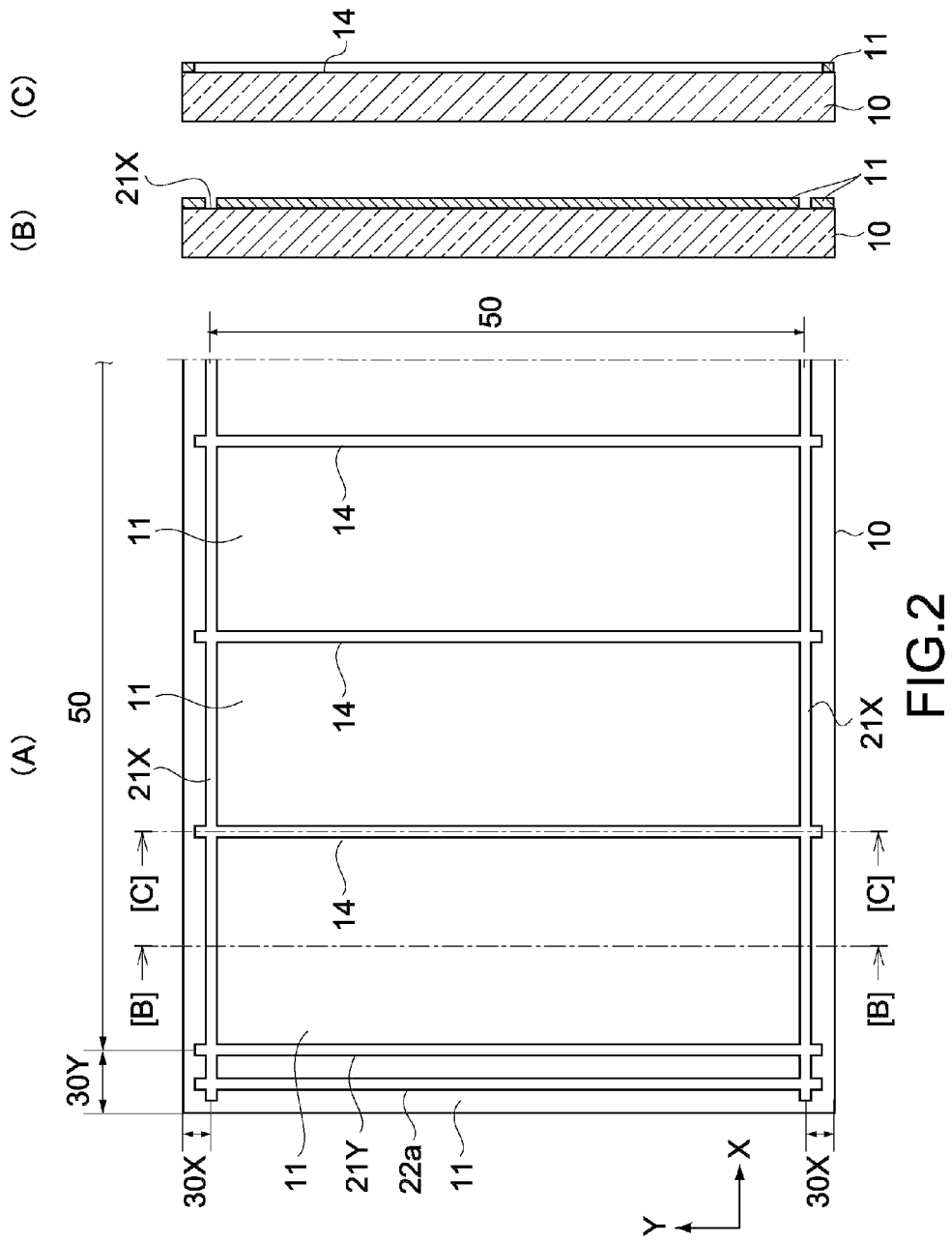
FIG. 2(A) is a plan view showing the process of FIG. 1(A), and (B) and (C) are cross-sectional diagrams taken along directions of the line [B]-[B] and the line [C]-[C] in (A), respectively.

FIG. 2(A) is a plan view of FIG. 1(A). After the transparent electrode layer 11 is formed, the transparent electrode layer 11 is laser-scribed to form electrode isolation trenches 14, region isolation trenches 21X and 21Y, and isolation trenches 22a. FIGS. 2(B) and (C) are cross-sectional diagrams taken along directions of the line [B]-[B] and the line [C]-[C] in FIG. 2(A), respectively. The region isolation trench 21X is intended to reduce an influence of processing damage in a peripheral region on module characteristics. The number of region isolation trenches 21X to be formed may be one on each long side of the substrate 10, or may be 2 or more. The increased number of trenches is effective in reducing the influence of processing damage in the peripheral region on module characteristics, but a cell area that is effective in power generation is reduced.

A plurality of electrode isolation trenches 14 are formed in parallel to each other at arbitrary intervals along a Y direction of the transparent substrate 10 (short-side direction of transparent substrate 10).

The region isolation trench 21X is for isolating a peripheral region 30X on each long side of the transparent substrate 10 and a power generation region 50 on an inner side of the peripheral region 30X. The region isolation trench 21X is formed along an X direction (long-side direction of transparent substrate 10).

The other region isolation trench 21Y is for isolating a peripheral region 30Y on each short side of the transparent substrate 10 and the power generation region 50 on an inner side of the peripheral region 30Y. The region isolation trench 21Y is formed along the Y direction (short-side direction of transparent substrate 10).

Those region isolation trenches 21X and 21Y are formed to have a depth at which each of the trenches reaches the surface of the transparent substrate 10. It should be noted that each of the region isolation trenches 21X and 21Y corresponds to a "first isolation trench" according to the present invention.

The isolation trench 22a is formed at a position closer to the peripheral region 30Y side than the region isolation trench 21Y. The isolation trench 22a is formed to have a depth at which the isolation trench 22a reaches the surface of the transparent substrate 10. The position at which the isolation trench 22a is formed is not particularly limited as long as the position falls within the peripheral region 30Y. It should be noted that the isolation trench 22a corresponds to a "second isolation trench" according to the present invention.

The laser scribing is to apply a light beam from a front surface side or a back surface side of the transparent substrate 10 to remove a predetermined region of the transparent electrode layer 11, in which a laser wavelength or an oscillation output is set appropriately depending on the type of a material to be removed, or the like. The laser beam may be a continuous laser beam or may be a pulse laser beam that causes less thermal damage to the device. It should be noted that the above description also applies to the laser scribing for a semiconductor layer 13 and a backside electrode layer 12 to be described later.

(Process of FIG. 1(B))

Next, as shown in FIG. 1(B), a semiconductor layer 13 is formed on the entire surface of the transparent substrate 10 on which the transparent electrode layer 11 is formed. The semiconductor layer 13 is embedded also in the electrode isolation trenches 14 formed in the transparent electrode layer 11.

The semiconductor layer 13 is formed of a laminated body of a p-type semiconductor film, an i-type semiconductor film, and an n-type semiconductor film. In this embodiment, the p-type semiconductor film is formed of a p-type amorphous silicon film, the i-type semiconductor film is formed of an i-type amorphous silicon film, and the n-type semiconductor film is formed of an n-type microcrystalline silicon film. In the above example, the amorphous silicon film can be changed for a microcrystalline silicon film, and the microcrystalline silicon film can be changed for an amorphous silicon film as appropriate. The semiconductor layer 13 may be a tandem type or a triple type in which a plurality of units (pin, pinp, npin, . . . , etc.) including a plurality of power generation layers are laminated, and may be provided with intermediate layers between the power generation layers at that time. The semiconductor films described above can be formed by a plasma CVD method. The thickness of each semiconductor film is not particularly limited and is set as appropriate in accordance with the specifications.

(Process of FIG. 1(C))

Subsequently, as shown in FIG. 1(C), connection trenches 15 are formed in a predetermined region of the semiconductor layer 13. Each of the connection trenches 15 has a depth at which the connection trench 15 reaches the surface of the transparent electrode layer 11 as a coating layer.

Figure 3:
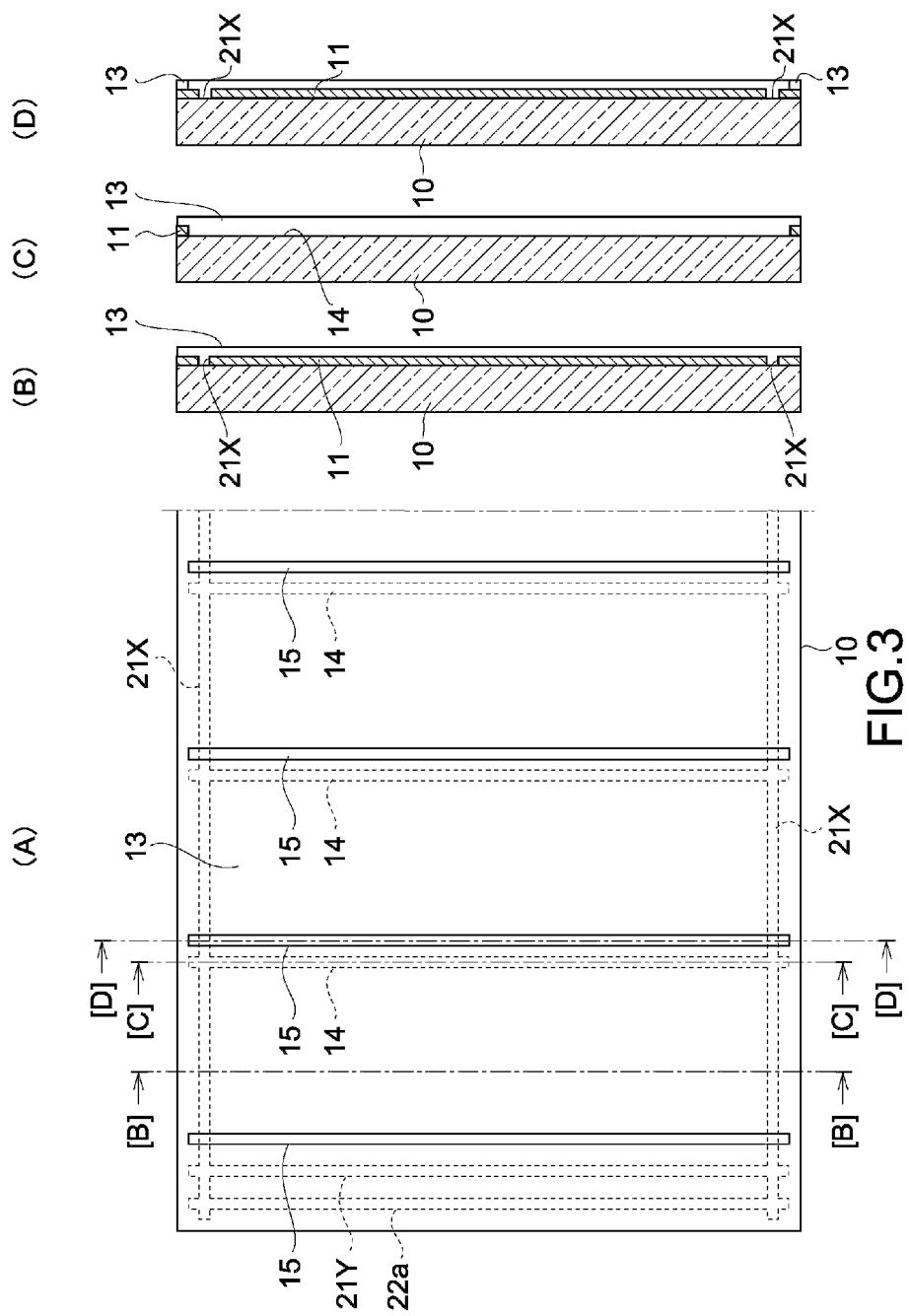
FIG. 3(A) is a plan view showing the process of FIG. 1(C), and (B), (C), and (D) are cross-sectional diagrams taken along directions of the line [B]-[B], the line [C]-[C], and the line [D]-[D] in (A), respectively.

FIG. 3(A) is a plan view of FIG. 1(C). After the semiconductor layer 13 is formed, the semiconductor layer 13 is laser-scribed to form the connection trenches 15. FIGS. 3(B), (C), and (D) are cross-sectional diagrams taken along directions of the line [B]-[B], the line [C]-[C], and the line [D]-[D] in FIG. 3(A), respectively.

(Process of FIG. 1(D))

Next, as shown in FIG. 1(D), a backside electrode layer 12 is formed as a second electrode layer on the entire surface of the transparent substrate 10 on which the transparent electrode layer 11 and the semiconductor layer 13 are formed. The backside electrode layer 12 is embedded also in the connection trenches 15 formed in the semiconductor layer 13.

The backside electrode layer 12 is formed of a ZnO layer and an Ag layer having excellent light reflection characteristics in this embodiment, but it can be formed of other metal such as Al, Cr, Mo, W, and Ti, or an alloy film instead of the Ag layer. The transparent electrode layer 11 is formed on the entire surface of the transparent substrate 10 in a predetermined thickness by a CVD method, a sputtering method, a coating method, or the like.

(Process of FIG. 1(E))

Subsequently, as shown in FIG. 1(E), predetermined regions of the backside electrode layer 12 are laser-scribed to form device isolation trenches 16, terminal connection trenches 17, isolation trenches 22Y, and boundary isolation trenches 23.

Figure 4:
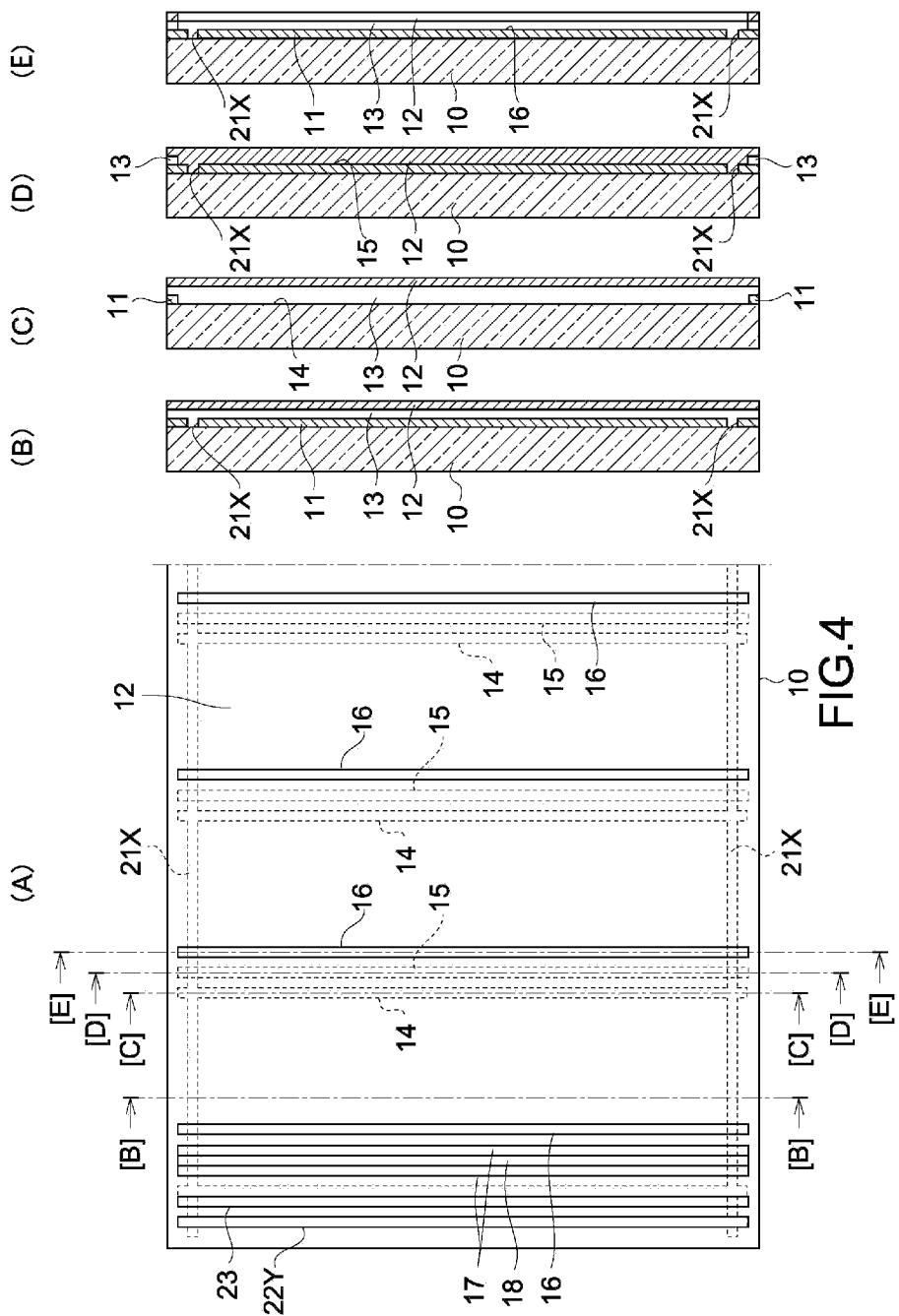
FIG. 4(A) is a plan view showing the process of FIG. 1(E), and (B), (C), (D), and (E) are cross-sectional diagrams taken along directions of the line [B]-[B], the line [C]-[C], the line [D]-[D], and the line [E]-[E] in (A), respectively.

The device isolation trenches 16 are formed to have a depth at which each of the trenches reaches the surface of the transparent electrode layer 11. FIG. 4(A) is a plan view of FIG. 1(E). FIGS. 4(B), (C), (D), and (E) are cross-sectional diagrams taken along directions of the line [B]-[B], the line [C]-[C], the line [D]-[D], and the line [E]-[E] in FIG. 4(A), respectively.

The terminal connection trenches 17 are connection trenches for connecting terminal layers 19 described later to the transparent electrode layer 11, the terminal connection trenches 17 being formed in predetermined positions of the power generation region 50 that face the peripheral region 30Y of the transparent substrate 10. The terminal connection trenches 17 are formed as a pair to have a depth at which each of the trenches reaches the surface of the transparent electrode layer 11 by laser-scribing the backside electrode layer 12 and the semiconductor layer 13 such that the connection trench 15 formed in the semiconductor layer 13 and embedded with a backside electrode material is interposed between the terminal connection trenches 17. The terminal connection trenches 17 are similarly formed in not only one peripheral region 30Y side shown in the figures but also the other peripheral region side not shown.

Further, a terminal connection layer 18 made of a backside electrode material that is interposed between the terminal connection trenches 17 is formed simultaneously with the formation of the terminal connection trenches 17.

The isolation trench 22Y is formed by laser-scribing the backside electrode layer 12 and the semiconductor layer 13 at the same position as that of the isolation trench 22a (FIG. 1(A)) that is formed in the transparent electrode layer 11 in the peripheral region 30Y. The isolation trench 22Y is formed to have a depth at which the isolation trench 22Y reaches the surface of the transparent substrate 10 in the peripheral region 30Y on each short side of the transparent substrate 10.

Figure 5:
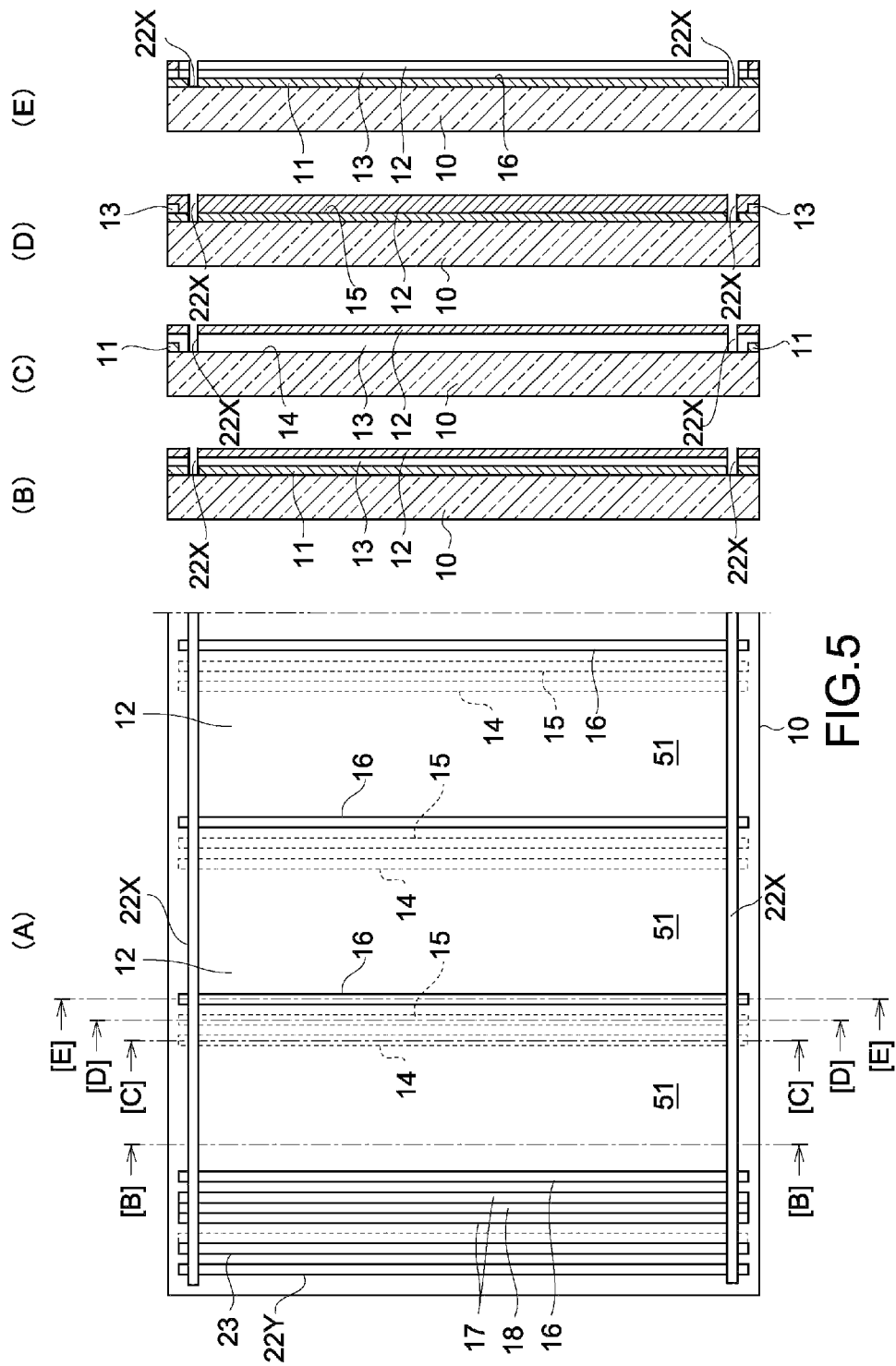
FIG. 5(A) is a plan view showing isolation trenches (second isolation trenches) formed in peripheral regions on long sides of a transparent substrate, and (B), (C), (D), and (E) are cross-sectional diagrams taken along directions of the line [B]-[B], the line [C]-[C], the line [D]-[D], and the line [E]-[E] in (A), respectively.

The isolation trenches described above are formed in not only the peripheral regions 30Y on the short sides of the transparent substrate 10 but also the peripheral regions 30X on long sides thereof. FIG. 5(A) is a plan view showing isolation trenches 22X formed in the peripheral regions 30X on the long sides of the transparent substrate 10. Further, FIG. 5(B), (C), (D), and (E) are cross-sectional diagrams taken along directions of the line [B]-[B], the line [C]-[C], the line [D]-[D], and the line [E]-[E] in FIG. 5(A), respectively. The isolation trenches 22X are formed to have a depth at which each of the isolation trenches 22X reaches the surface of the transparent substrate 10.

The boundary isolation trench 23 is formed by laser-scribing the backside electrode layer 12 and the semiconductor layer 13 at a predetermined position located inwardly from the isolation trench 22Y in each of the peripheral regions 30Y of the transparent substrate 10. The boundary isolation trench 23 is formed to have a depth at which the boundary isolation trench 23 reaches the surface of the transparent electrode layer 11 in this embodiment, but the boundary isolation trench 23 is not limited thereto. The boundary isolation trench 23 may be formed to have a depth at which the boundary isolation trench 23 reaches the surface of the transparent substrate 10. The boundary isolation trench 23 forms a boundary between a blast region and a non-blast region in a blast treatment process to be described later. It should be noted that the boundary isolation trench 23 corresponds to a "third isolation trench" according to the present invention.

Through the above process of forming the isolation trenches 22X and 22Y, a plurality of solar cells 51 are structured in the power generation region 50. In each of the solar cells 51, the backside electrode layer 12 is electrically connected to the transparent electrode layer 11 of another adjacent cell via the connection trench 15. The module structure in which the solar cells 51 are connected to each other in series as in this embodiment can be applied to a power generation module in which a generated current is sufficient but a generated voltage is relatively low. On the other hand, a module structure in which solar cells are connected in parallel to each other can be applied to a power generation module in which a generated voltage is sufficient but a generated current is relatively low.

(Process of FIG. 1(F))

Figure 6:
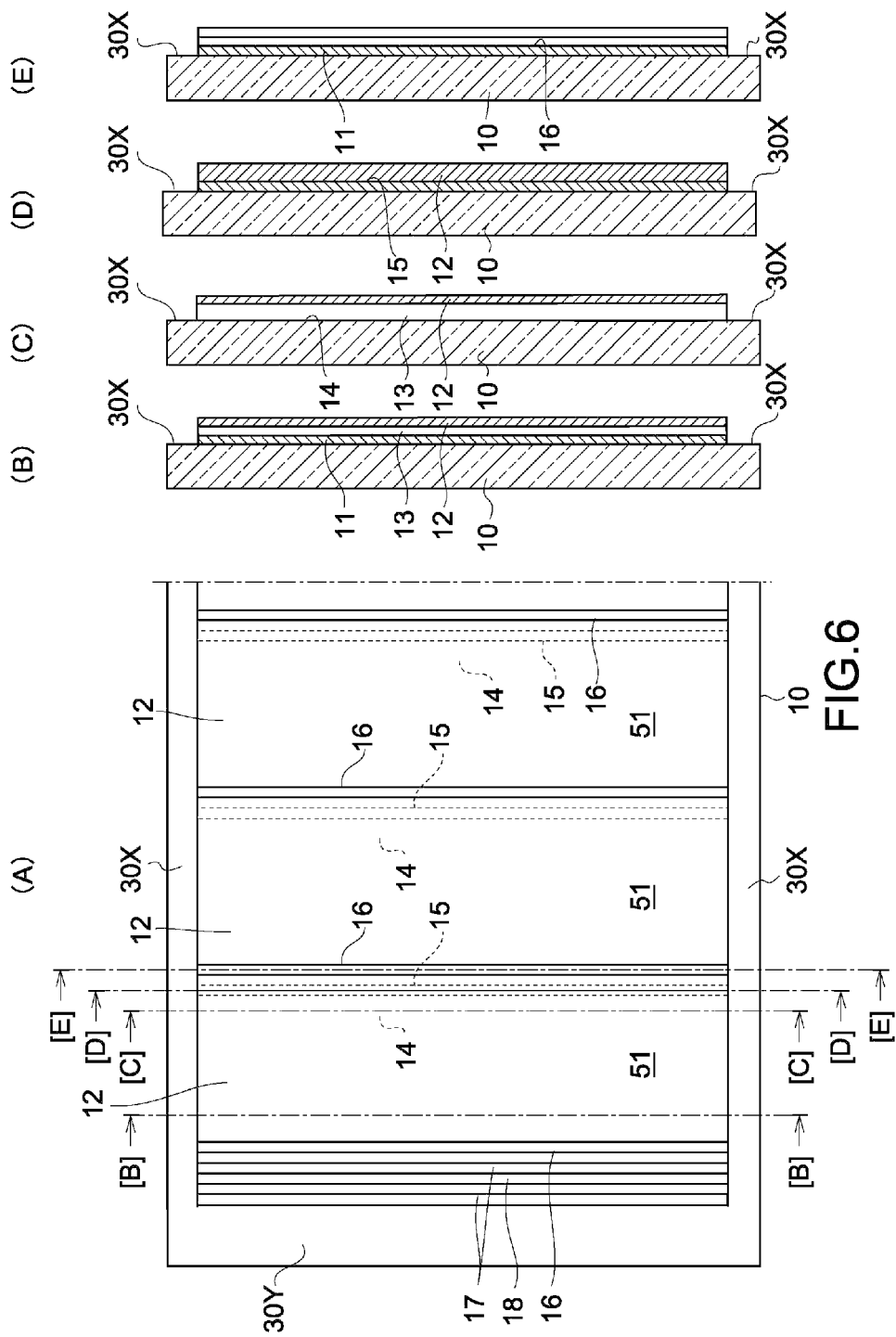
FIG. 6(A) is a plan view of FIG. 1(F), and (B) and (C) are cross-sectional diagrams taken along directions of the line [B]-[B] and the line [C]-[C] in (A), respectively.

Next, as shown in FIG. 1(F) and FIG. 6, the peripheral regions 30X and 30Y of the transparent substrate 10 are subjected to blast treatment. As a result, the transparent electrode layer 11, the semiconductor layer 13, and the backside electrode layer 12 on the peripheral regions 30X and 30Y are removed. FIG. 6(A) is a plan view of FIG. 1(F), and FIGS. 6(B) and 6(C) are cross-sectional diagrams taken along directions of the line [B]-[B] and the line [C]-[C] in FIG. 2(A), respectively.

Conditions of the blast treatment are not particularly limited as long as the transparent electrode layer 11, the semiconductor layer 13, and the backside electrode layer 12 on the peripheral regions 30X and 30Y can be appropriately removed. Blast particles are not limited to ceramic particles such as alumina particles and silica particles, and metal-based particles or plant-based particles may be used therefor. Further, at a time of the blast treatment, the surface of the transparent substrate 10 may be subjected to masking such that the blast particles are not applied to the power generation region 50.

Further, in this embodiment, the semiconductor layer 13 that is embedded in the region isolation trenches 21X and 21Y for isolating the peripheral regions 30Y from the power generation region 50 is not completely removed, and is left so as to cover the circumference of the transparent electrode layer 11 as shown in FIG. 1(F). As a result, the circumference of the transparent electrode layer 11 is prevented from being directly exposed to the outside.

(Process of FIG. 1(G))

Figure 7:
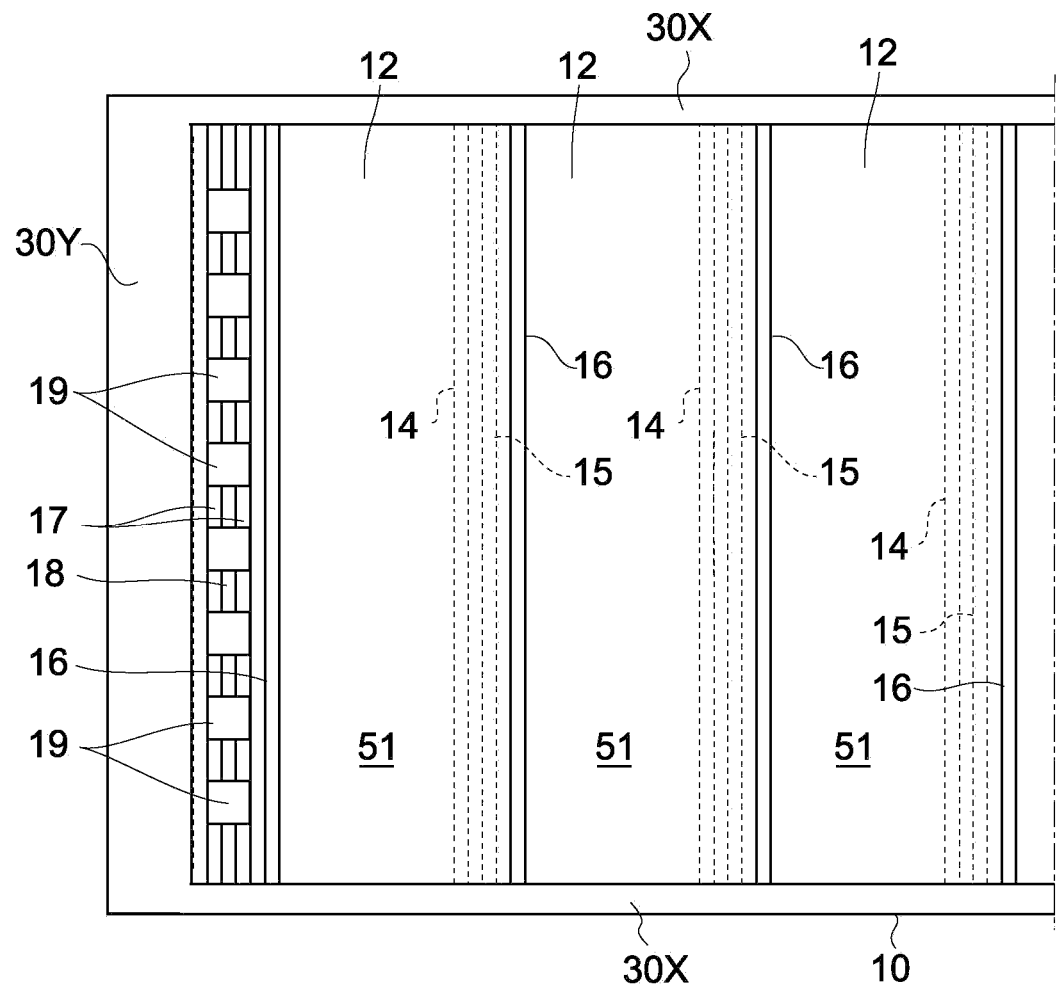
FIG. 7 is a plan view of FIG. 1(G)

Subsequently, as shown in FIG. 1(G) and FIG. 7, terminal layers 19 are formed by embedding a conductive material in the terminal connection trenches 17. The terminal layers 19 are formed so as to straddle the terminal connection layer 18. In this embodiment, the terminal layers 19 are formed at intervals along an extending direction of the terminal layers 19 as shown in FIG. 7. The terminal layers 19 are formed at side portions on both the short sides of the transparent substrate 10. It should be noted that the terminal layers 19 may be continuously formed over the entire formation region of the terminal layers 19.

The terminal layers 19 can be formed using appropriate methods such as a method of using a conductive adhesive, a method of forming a metal plating layer made of Cu or the like, and a method of pressure-bonding a metal block onto a substrate, in addition to a method of performing reflowing after applying a solder paste.

Lastly, a sealing layer 25 made of an insulating resin that covers the entire surface of the transparent substrate 10 (FIG. 1(G)) is formed, thus sealing the solar cells 51 on the transparent substrate 10. Further, corner portions of the circumference of the transparent substrate 10 are chamfered as appropriate. The chamfering process is performed for the purpose of preventing breakage of the transparent substrate 10 at a time of handling or processing among processes. Therefore, the chamfering process may be performed, though not limited to the last process, before a process of forming the transparent electrode layer 11 or among arbitrary processes.

In this manner, the thin-film solar battery module 1 including the plurality of solar cells 51 that are integrated on the transparent substrate 10 is manufactured. The thin-film solar battery module 1 is installed with the transparent substrate 10 side as a light-incident surface. Sunlight that enters from the transparent substrate 10 enters the semiconductor layer 13 via the transparent electrode layer 11, and the semiconductor layer 13 causes a photoelectric conversion effect in accordance with the incident light. A voltage generated in the semiconductor layer 13 is taken by the transparent electrode layer 11 and the backside electrode layer 12 and supplied to an external capacitor (not shown) via the terminal layers 19.

As described above, in this embodiment, after the isolation trenches 22X and 22Y as second isolation trenches are additionally formed on outer sides of the region isolation trenches 21X and 21Y as first isolation trenches (peripheral regions 30X side and peripheral regions 30Y side), the peripheral regions 30X and 30Y including the isolation trenches 22X and 22Y are subjected to the blast treatment to remove the transparent electrode layer 11, the semiconductor layer 13, and the backside electrode layer 12 on the peripheral regions. As a result, even when the isolation trenches 22X and 22Y are not appropriately formed or residues of the conductive material remain in the isolation trenches 22X and 22Y, a dielectric breakdown voltage between the peripheral regions 30X and 30Y and the power generation region 50 can be secured in a subsequent blast treatment process.

Thus, according to this embodiment, the peripheral regions 30X and 30Y and the power generation region 50 in the thin-film solar battery module 1 can be electrically isolated from each other reliably, with the result that it is possible to secure dielectric breakdown voltage characteristics of high reliability with respect to the infiltration of moisture or the like from the outside, the moisture intervening between the transparent substrate 10 and the sealing layer 25.

Further, the electric isolation treatment between the peripheral regions 30X and 30Y and the power generation region 50 is performed in two processes, the process of forming the isolation trenches 22X and 22Y with respect to the peripheral regions and the blast treatment process. Therefore, even when one treatment is imperfectly performed, the imperfection thereof can be compensated with the other treatment. As a result, it is possible to reduce a load on control of process in the both treatment.

Further, in this embodiment, the isolation trench 22a is formed in advance at a corresponding position of the transparent electrode layer 11 at a time when the isolation trench 22X is formed. As a result, the transparent electrode layer 11 that is difficult to be removed by laser scribing as compared to the semiconductor layer 13 is unnecessary to be removed when the isolation trench 22Y is formed, with the result that the isolation trench 22X of high reliability can be stably formed.

Further, in this embodiment, the boundary isolation trench 23 as a third isolation trench is formed between the region isolation trench 21Y and the isolation trench 22Y. As a result, it is possible to further enhance the reliability of the isolation between the peripheral region 30Y and the power generation region 50 at the time of the blast treatment, and to enhance shape accuracy of a boundary portion between the blast treatment region and the non-blast region after the blast treatment.

Further, in this embodiment, the semiconductor layer 13 that is embedded in the region isolation trench 21Y for isolating the peripheral region 30Y from the power generation region 50 is not completely removed, and is left so as to cover the circumference of the transparent electrode layer 11 as shown in FIG. 1(F). As a result, the circumference of the transparent electrode layer 11 is prevented from being exposed to the outside, and since the semiconductor layer 13 has higher resistance than the transparent electrode layer 11, the dielectric breakdown voltage between the circumference of the transparent electrode layer 11 and the peripheral region 30Y can be additionally improved.

Further, in this embodiment, the terminal connection layer 18 formed of a backside electrode material is brought into direct contact with the transparent electrode layer 11, and the terminal layers 19 are formed so as to straddle the terminal connection layer 18. As a result, the terminal layers 19 and the transparent electrode layer 11 can be electrically connected to each other reliably, and contact resistance therebetween can be reduced at the same time. Accordingly, a series-connection-type thin-film solar battery module 1 enables a great reduction in loss of a generated voltage.

Second Embodiment

Figure 8:
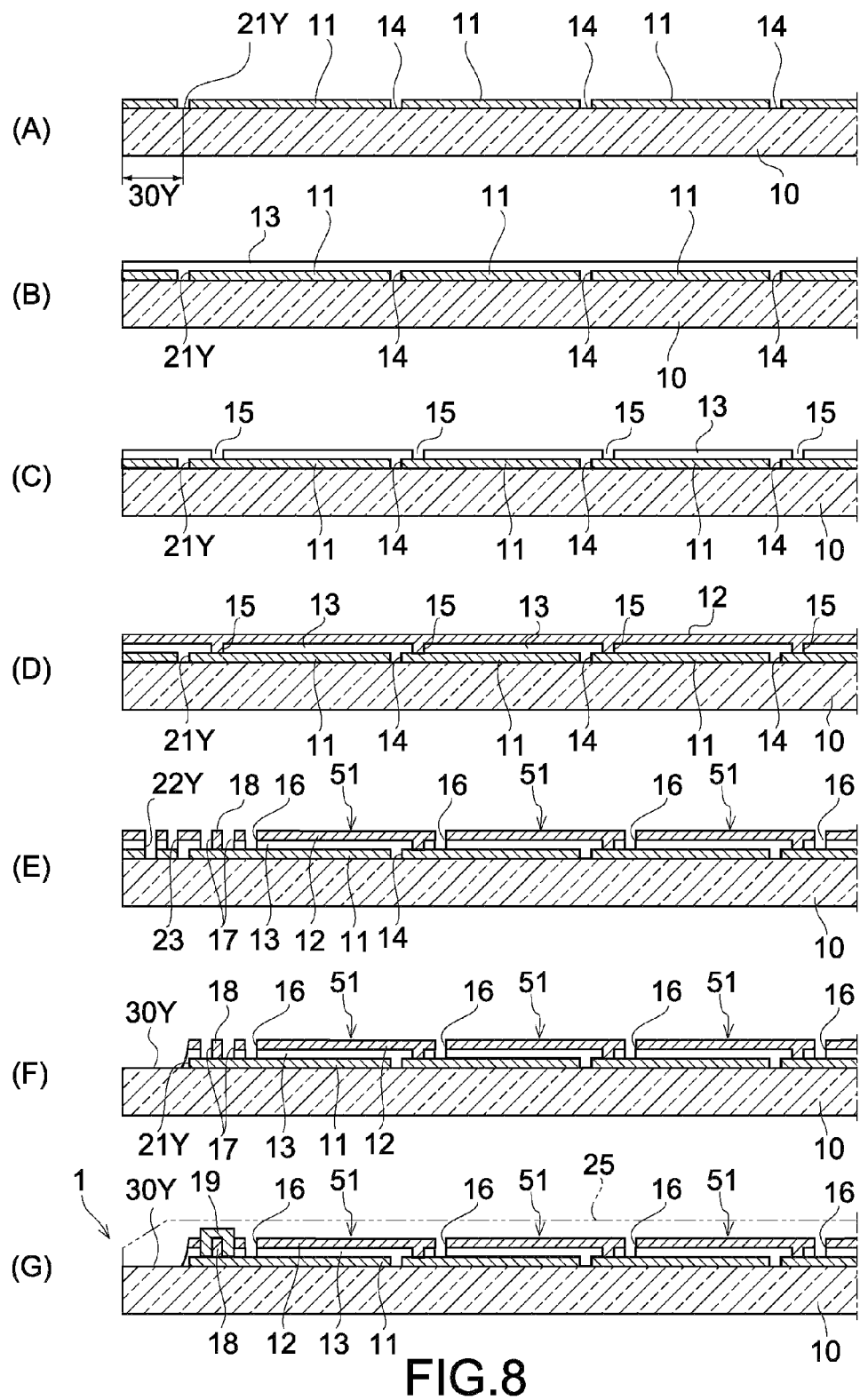
FIG. 8 are main part cross-sectional diagrams for describing processes of a thin-film solar battery module manufacturing method according to a second embodiment of the present invention.

FIG. 8 are main part cross-sectional diagrams for describing processes of a thin-film solar battery module manufacturing method according to a second embodiment of the present invention. It should be noted that portions in the figures that correspond to those in the first embodiment described above are denoted by the same reference symbols and detailed descriptions thereof are omitted.

This embodiment is different from the first embodiment described above in that, as shown in FIG. 8(A), the isolation trench 22a (FIG. 1(A)) is not formed in the peripheral region of the transparent substrate 10 at a time when the electrode isolation trenches 14 are formed in the transparent electrode layer 11. Specifically, in this embodiment, in the process of forming the isolation trench 22Y shown in FIG. 8(E), the backside electrode layer 12, the semiconductor layer 13, and the transparent electrode layer 11 that are located at a position where the isolation trench 22Y is to be formed are laser-scribed to form the isolation trench 22Y.

It should be noted that since the other processes are the same as those in the first embodiment described above, descriptions thereof are omitted.

Also in this embodiment, an action and an effect that are similar to those in the first embodiment described above can be obtained. Specifically, after the isolation trenches 22X and 22Y as second isolation trenches are additionally formed on outer sides of the region isolation trenches 21X and 21Y as first isolation trenches (peripheral regions 30X side and peripheral regions 30Y side), the peripheral regions 30X and 30Y including the isolation trenches 22X and 22Y are subjected to the blast treatment to remove the transparent electrode layer 11, the semiconductor layer 13, and the backside electrode layer 12 on the peripheral regions. As a result, the peripheral regions 30X and 30Y and the power generation region 50 in the thin-film solar battery module 1 can be electrically isolated from each other reliably, with the result that it is possible to secure dielectric breakdown voltage characteristics of high reliability with respect to the infiltration of moisture or the like from the outside, the moisture intervening between the transparent substrate 10 and the sealing layer 25.

Particularly in this embodiment, since the isolation trench 22a is not formed at the time when the electrode isolation trenches 14 are formed, a treatment time required for implementing the process shown in FIG. 8(A) can be shortened accordingly more than in the first embodiment described above. As a result, the improvement of the productivity of the thin-film solar battery module 1 and the reduction in manufacturing costs can be achieved.

Third Embodiment

Figure 9:
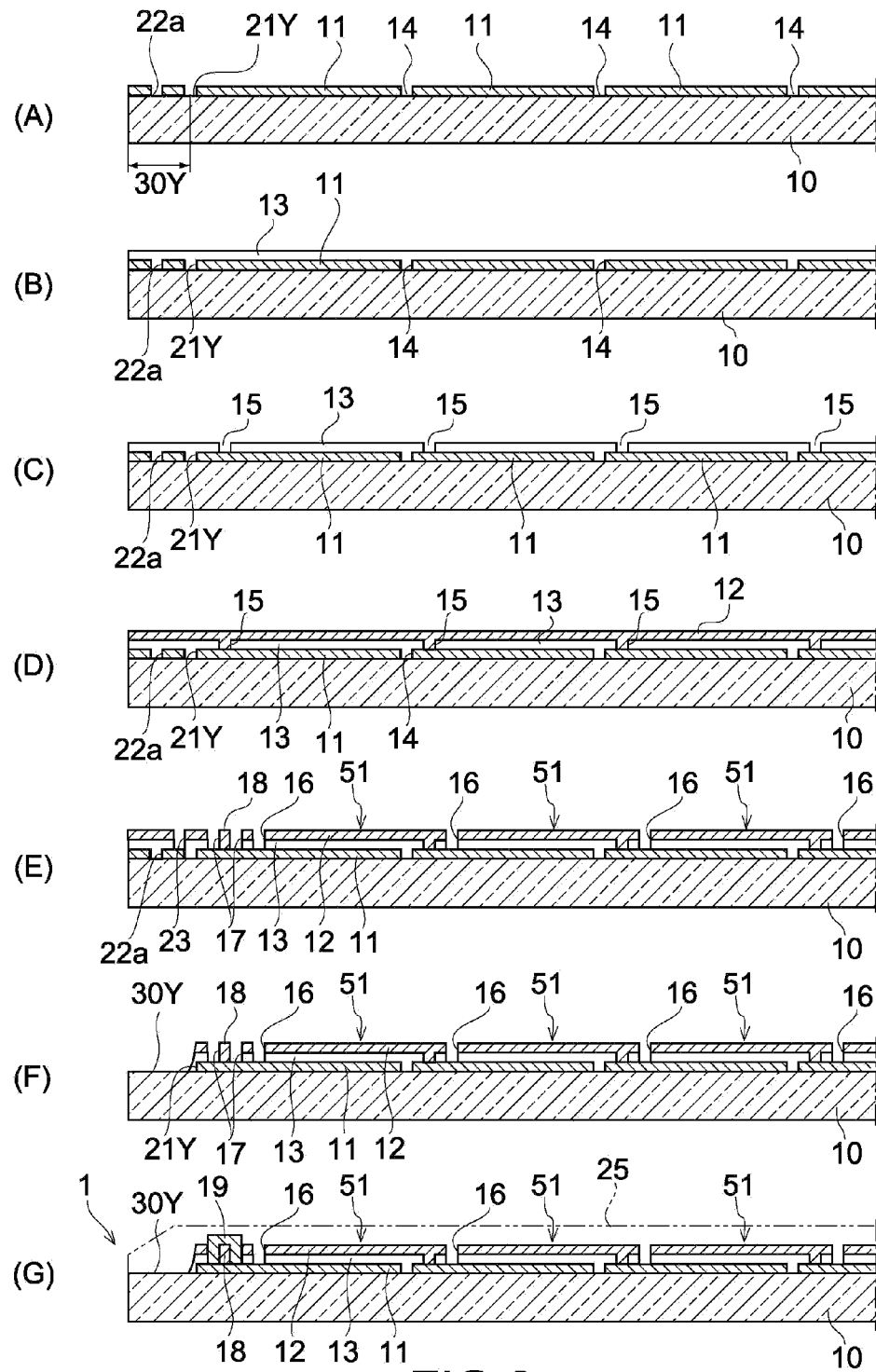
FIG. 9 are main part cross-sectional diagrams for describing processes of a thin-film solar battery module manufacturing method according to a third embodiment of the present invention.

FIG. 9 are main part cross-sectional diagrams for describing processes of a thin-film solar battery module manufacturing method according to a third embodiment of the present invention. It should be noted that portions in the figures that correspond to those in the first embodiment described above are denoted by the same reference symbols and detailed descriptions thereof are omitted.

This embodiment and the first embodiment described above have in common that, as shown in FIG. 9(A), the isolation trench 22a is formed in the peripheral region of the transparent substrate 10 at a time when the electrode isolation trenches 14 are formed in the transparent electrode layer 11. However, this embodiment is different from the first embodiment described above in that, as shown in FIG. 9(E), the isolation trench 22Y (FIG. 1(E)) is not formed so as to overlap the isolation trench 22a at a time when the device isolation trenches 16 are formed. It should be noted that the isolation trenches 22X (FIG. 5(A)) along the long sides of the transparent substrate 10 are formed.

It should be noted that since the other processes are the same as those in the first embodiment described above, descriptions thereof are omitted.

Also in this embodiment, an action and an effect that are similar to those in the first embodiment described above can be obtained. Specifically, after the isolation trenches 22a and 22Y as second isolation trenches are additionally formed on outer sides of the region isolation trenches 21X and 21Y as first isolation trenches (peripheral regions 30X side and peripheral regions 30Y side), the peripheral regions 30X and 30Y including the isolation trenches 22a and 22Y are subjected to the blast treatment to remove the transparent electrode layer 11, the semiconductor layer 13, and the backside electrode layer 12 on the peripheral regions. As a result, the peripheral regions 30X and 30Y and the power generation region 50 in the thin-film solar battery module 1 can be electrically isolated from each other reliably, with the result that it is possible to secure dielectric breakdown voltage characteristics of high reliability with respect to the infiltration of moisture or the like from the outside, the moisture intervening between the transparent substrate 10 and the sealing layer 25.

Particularly in this embodiment, since the isolation trench 22Y is not formed at the time when the device isolation trenches 16 are formed, a treatment time required for implementing the process shown in FIG. 8(E) can be shortened accordingly more than in the first embodiment described above. As a result, the improvement of the productivity of the thin-film solar battery module 1 and the reduction in manufacturing costs can be achieved.

Though the embodiments of the present invention have been described up to here, the present invention is not limited to the embodiments described above, and various changes can of course be added without departing from the gist of the present invention.

For example, a formed width of each of the electrode isolation trenches 14, the connection trenches 15, the device isolation trenches 16, the terminal connection trenches 17, the region isolation trenches 21X and 21Y, the isolation trenches 22a, 22X and 22Y, and the boundary isolation trenches 23 is not particularly mentioned in the embodiments described above. However, those trench widths can be set as appropriate based on the specifications of the thin-film solar battery module 1, laser oscillation conditions of laser scribing, or the like.

Further, though the method of manufacturing the thin-film solar battery module 1 in which the solar cells 51 are connected to each other in series has been described as an example in the embodiments described above, the present invention is not limited thereto. The present invention is also applicable to a method of manufacturing a thin-film solar battery module in which solar cells are connected in parallel to each other.

The invention claimed is:

1. A thin-film solar battery module manufacturing method, comprising:
    forming a first electrode layer on an insulating transparent substrate;
    forming a first isolation trench that isolates a peripheral region of the transparent substrate from a power generation region on an inner side thereof, to have a depth at which the first isolation trench reaches a surface of the transparent substrate;
    forming a semiconductor layer on the transparent substrate;
    forming a second electrode layer on the transparent substrate;
    forming a second isolation trench at a position closer to the peripheral region side than the first isolation trench, to have a depth at which the second isolation trench reaches the surface of the transparent substrate; and
    removing the first electrode layer, the semiconductor layer, and the second electrode layer formed in the peripheral region, by performing blast treatment on the peripheral region including the second isolation trench.

2. The thin-film solar battery module manufacturing method according to claim 1,
    wherein the forming a second isolation trench includes laser-scribing, after the second electrode layer is formed, the second electrode layer, the semiconductor layer, and the first electrode layer that are located at a position where the second isolation trench is to be formed.

3. The thin-film solar battery module manufacturing method according to claim 1,
    wherein the forming a second isolation trench includes laser-scribing, after the first electrode layer is formed, the first electrode layer that is located at a position where the second isolation trench is to be formed, and laser-scribing, after the second electrode layer is formed, the second electrode layer and the semiconductor layer that are located at the position where the second isolation trench is to be formed.

4. The thin-film solar battery module manufacturing method according to claim 1, further comprising
    forming a third isolation trench between the first isolation trench and the second isolation trench, to have a depth at which the third isolation trench reaches at least a surface of the first electrode layer.

5. The thin-film solar battery module manufacturing method according to claim 1,
    wherein the removing the first electrode layer, the semiconductor layer, and the second electrode layer formed in the peripheral region includes performing blast treatment on the peripheral region so that a circumference of the first electrode layer in the power generation region, the circumference facing the first isolation trench, is covered with the semiconductor layer embedded in the first isolation trench.

* * * * *